United States Patent
Hsu

(10) Patent No.: US 6,180,462 B1
(45) Date of Patent: Jan. 30, 2001

(54) METHOD OF FABRICATING AN ANALOG INTEGRATED CIRCUIT WITH ESD PROTECTION

(75) Inventor: Hsin-Wen Hsu, Taipei (TW)

(73) Assignee: United Microelectronics Corp., Hsinchu (TW)

(*) Notice: Under 35 U.S.C. 154(b), the term of this patent shall be extended for 0 days.

(21) Appl. No.: 09/327,128

(22) Filed: Jun. 7, 1999

(51) Int. Cl.[7] .................................. H01L 21/8234
(52) U.S. Cl. ...................... 438/275; 438/200; 438/210; 438/238
(58) Field of Search ........................ 257/304, 358, 257/535, 915, 355, 546; 438/197, 199, 210, 200, 238, 275, 301, 405

(56) References Cited

U.S. PATENT DOCUMENTS

| | | | |
|---|---|---|---|
| 3,679,942 | * 7/1972 | Daly | 361/322 |
| 5,432,129 | * 7/1995 | Hodges | 438/621 |
| 5,516,717 | * 5/1996 | Hsu | 438/275 |
| 5,585,299 | * 12/1996 | Hsu | 438/275 |
| 5,736,421 | * 4/1998 | Shimomura et al. | 438/253 |
| 5,897,348 | * 4/1999 | Wu | 438/200 |
| 6,008,077 | * 12/1999 | Maeda | 438/151 |

\* cited by examiner

*Primary Examiner*—Olik Chaudhuri
*Assistant Examiner*—Hoai Pham

(57) ABSTRACT

A method of fabricating an ESD protection circuit without salicide formation is described. First, the isolation regions, the dielectric layer, the gate structures, the resistors, the end capacitor electrodes and the doped regions are formed on the substrate. Next, the ESD areas and the capacitor areas are defined as the non-photolithography (i.e., non-photoresist) areas. Next, ion implantation is performed in the ESD areas and the capacitor areas. Next, an oxide layer is formed on the sidewall spacers of the gate structures, resistors, and end capacitor electrodes. Next, an oxide layer is formed over entire semiconductor substrate. Next, the oxide layer at the active areas is removed and than salicide process is performed. Finally, the doped polysilicon layer is performed to form the top capacitor electrode

10 Claims, 5 Drawing Sheets

METHOD OF FABRICATING AN ANALOG INTEGRATED CIRCUIT WITH ESD PROTECTION

BACKGROUND OF THE INVENTION (1) Field of the Invention

The present invention relates to a method of fabricating an electronic discharge (ESD) protection device, and more particularly to a process of forming a non-silicide ESD device.

(2) Description of the Related Art

Electrostatic discharge (ESD) devices exists when a quite large voltage usually generated by suddenly is released triboelectricity (electricity caused when two materials are rubbed together). For example, a person taking an integrated circuit from its plastic wrapping material or walking across a room can generate voltage up to 2000V. Such an unintended discharge getting into a metal oxide semiconductor field effect transistor (MOSFET) can cause immediately huge damage to the circuit or subsequent early life failure. ESD devices will not work if the circuit is exposed under the normal control voltage. ESD devices will turn on to prevent the circuit from huge damage, only when the voltage is higher than the normal control voltage.

In recent years, the sizes of the individual semiconductor devices have continuously decreased so that the integrated circuit density on chips has dramatically increased. As the sizes of the capacitors become smaller, so as the resistance values of the MOS transistors are increasing, the operational speed of the IC devices is reduced, causing the performance problem. Therefore, so-called salicide process has been developed to reduce the resistance of the MOS transistors. Unfortunately, the salicide process will reduce the capacity of the ESD protection circuit, too.

In order to solve such problem, an ESD protection circuit without salicide that is incorporated with MOS transistors with salicide is proposed. Referring to FIGS. 1A~1D a conventional fabrication method of an ESD protection circuit without salicide formation is depicted. An oxide layer should be formed on the ESD devices to form the non-silicide ESD devices and an dielectric layer also should be formed by depositing an oxide layer under the top capacitor electrode. As mentioned above, the process of deposition oxide layer is used twice in the conventional fabrication method of an ESD protection circuit.

Referring now to FIG. 1A, the conventional fabrication method of an ESD protection circuit without silicide formation is depicted. A silicon substrate 10 with a layer of gate oxide and a layer of field oxide 20 is provided. A first doped polysilicon layer is formed on the substrate 10. After that, a layer of gate oxide and a first doped polysilicon layer are defined to form a gate oxide layer 60 and gate structures 50 at the ESD areas A, a gate oxide layer 61 and resistors 51 at resistance areas B, a gate oxide layer 62 and gate electrodes 52 at active areas C and a dielectric layer 63 and end capacitor electrodes 53 at capacitor areas D. Then, Sidewall spacers 70 are formed at the sidewall of the gate structures 50, the resistors 51, the gate electrodes 52 and the end capacitor electrodes 53. Next, a process of ion implantation is performed to form the lightly doped source/drain 40 regions (LDD) and doped areas 30.

Next, please refer to FIG. 1A again, a first layer of oxide 100 on the substrate 10 and a doped polysilicon layer are formed. After defining the top capacitor electrodes 90 at the capacitor areas C, the residual first layer of oxide 100a is patterned to form the dielectric layer between the top capacitor electrodes and the end capacitor electrodes, as shown in FIG. 1B.

Next, refer to FIG. 1C, a second oxide layer 110 is formed at the ESD areas, resistance areas B and capacitor areas D. The second oxide 110 of active areas C is removed for the following salicide process on the gate electrodes 52, source/drain regions 40 of the active areas C. The second oxide layer 110 is formed on the ESD areas A to prevent the salicidation. Finally, as shown in FIG. 1D, the silicide layer 81 is formed on the gate electrodes 52 and source/drain regions 40.

As mentioned above, in accordance with the prior art, two oxide layers (first oxide layer 100 and second oxide layer 110) should be formed. The first oxide layer 100 is deposited to form the dielectric layer 100a between the end capacitor electrodes 53 and top capacitor electrodes 90. The second oxide layer 110 is deposited to form the isolation during the salicide process.

SUMMARY OF THE INVENTION

According, it is a primary object of the present invention to provide a method of fabricating an ESD protection circuit without salicide formation for integrated circuit devices with the advantages of simplifying process, reducing costs, and improving throughput.

It is another object of the present invention to provide a method of fabricating an ESD protection circuit without salicide formation for integrated circuit devices with the advantage of just forming one oxide layer.

It is yet another object of the present invention to provide a method of fabricating an ESD protection circuit with low voltage coefficient of capacitance that remains the better linear relation between the voltage and the capacitance.

These objects are accomplished by the fabrication process described below. First, the isolation regions, the dielectric layer, the gate structures, the resistors, the end capacitor electrodes and the doped regions are formed on the substrate. Next, the ESD areas and the capacitor areas are defined as the non-photolithography areas (i.e., non-photoresist). Next, ion implantation is performed in the ESD areas and the capacitor areas. Next, an oxide layer is formed on the sidewall spacers of the gate structures, the resistors, and the end capacitor electrodes. Next, an oxide layer is formed over entire semiconductor substrate. Next, the oxide layer at the active areas is removed and than salicide process is performed. Finally, the doped polysilicon layer is performed to form the top capacitor electrode.

BRIEF DESCRIPTION OF THE DRAWINGS

The accompanying drawings forming a material part of this description, in which.

DESCRIPTION OF THE PREFERRED EMBODIMENTS

Figure 1:
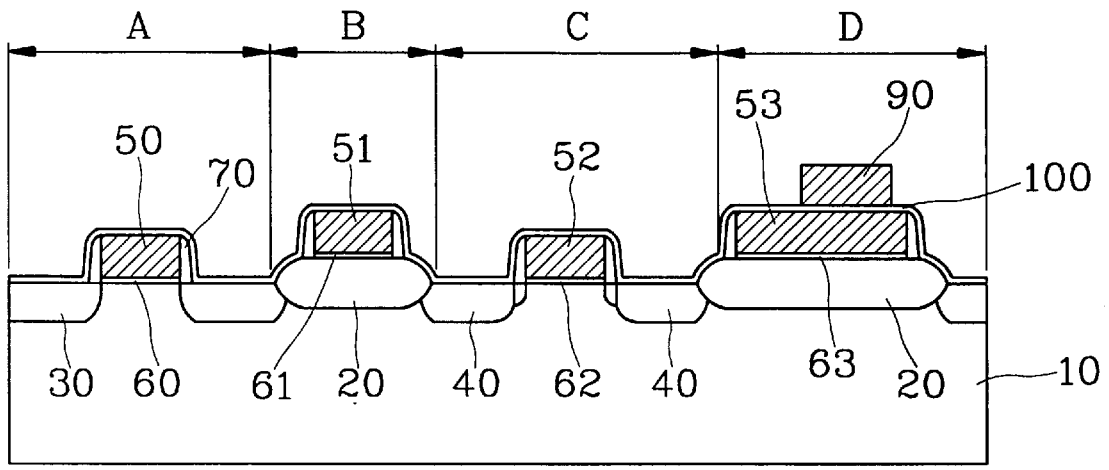
FIGS. 1A to 1D are cross sectional views of an ESD protection circuit according a conventional process.
Figure 1:
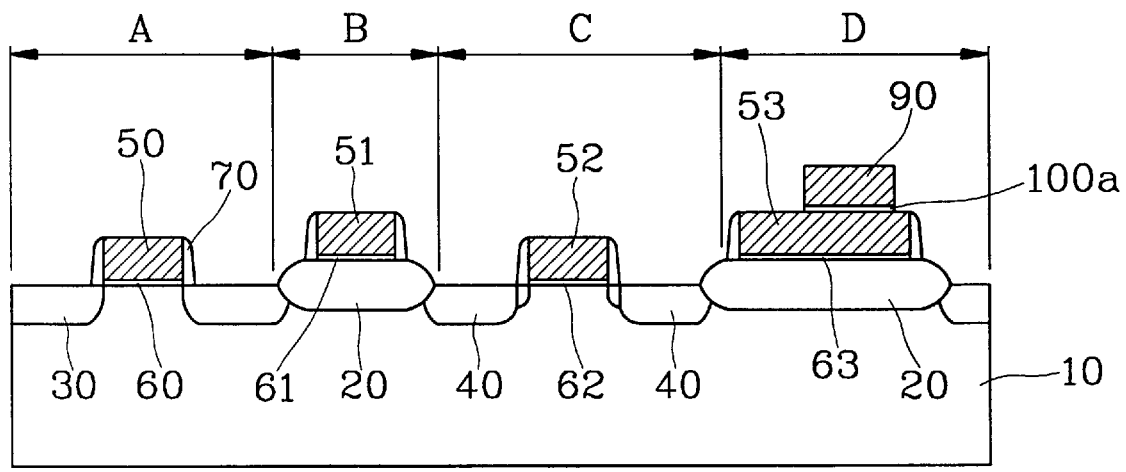
Figure 1:
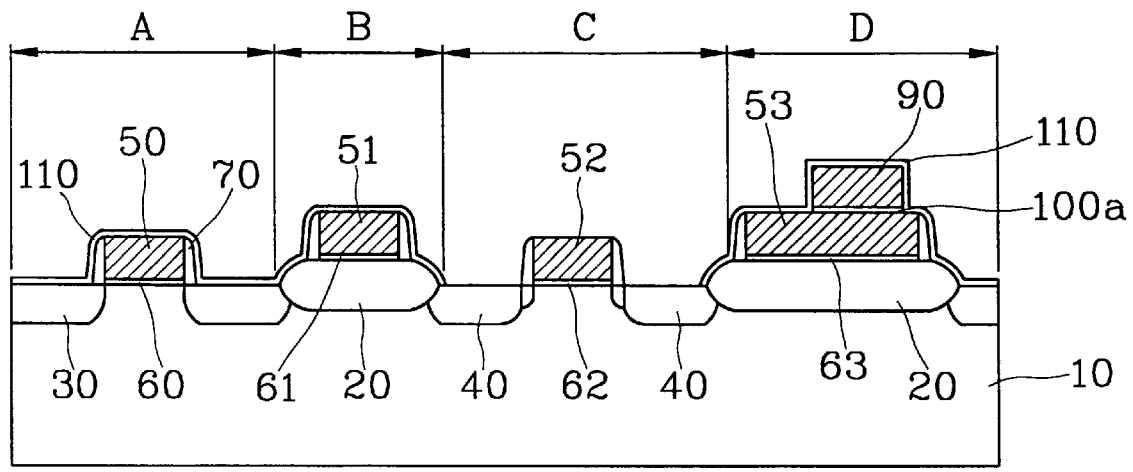
Figure 1:
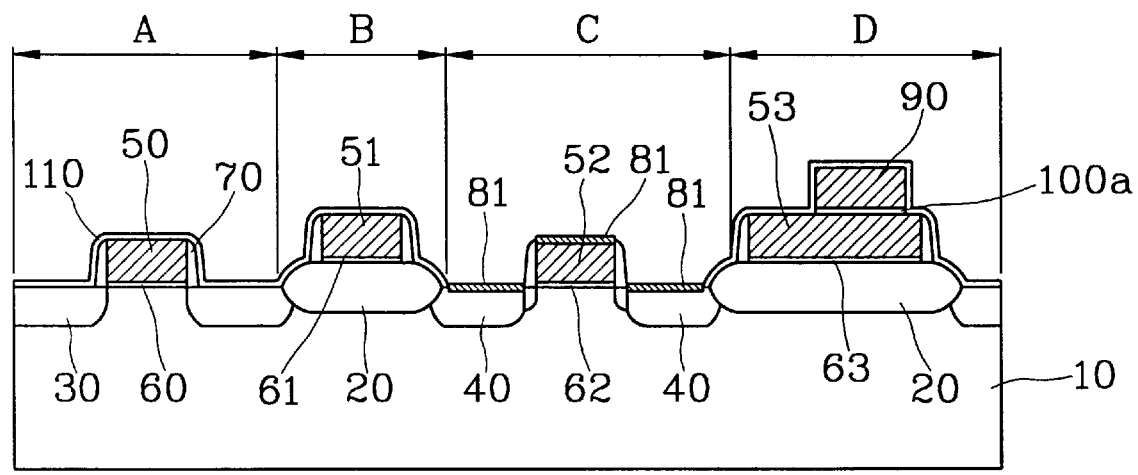
Figure 2:
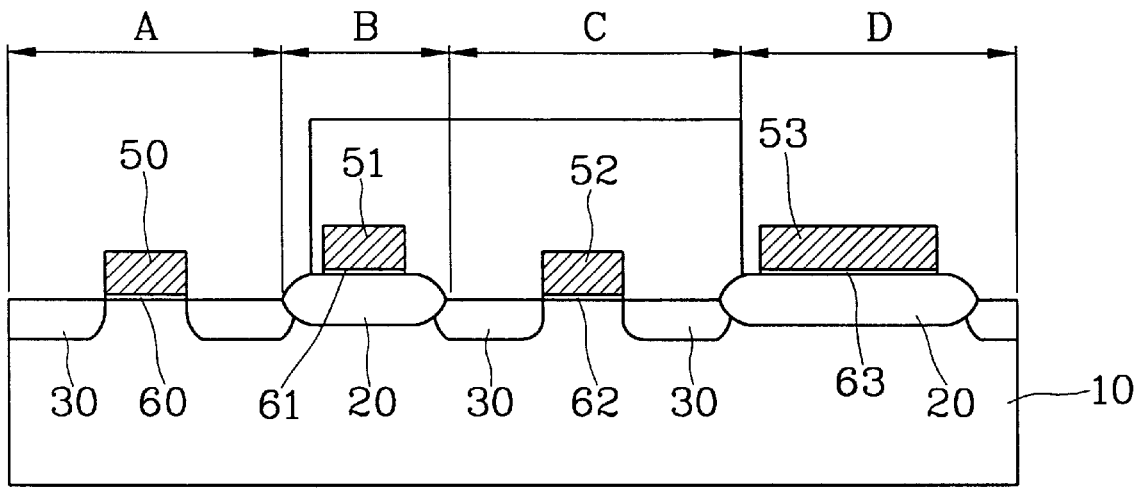
FIGS. 2A to 2E are cross sectional views of an ESD protection circuit without salicide formation according to an embodiment of the present invention.
Figure 2:
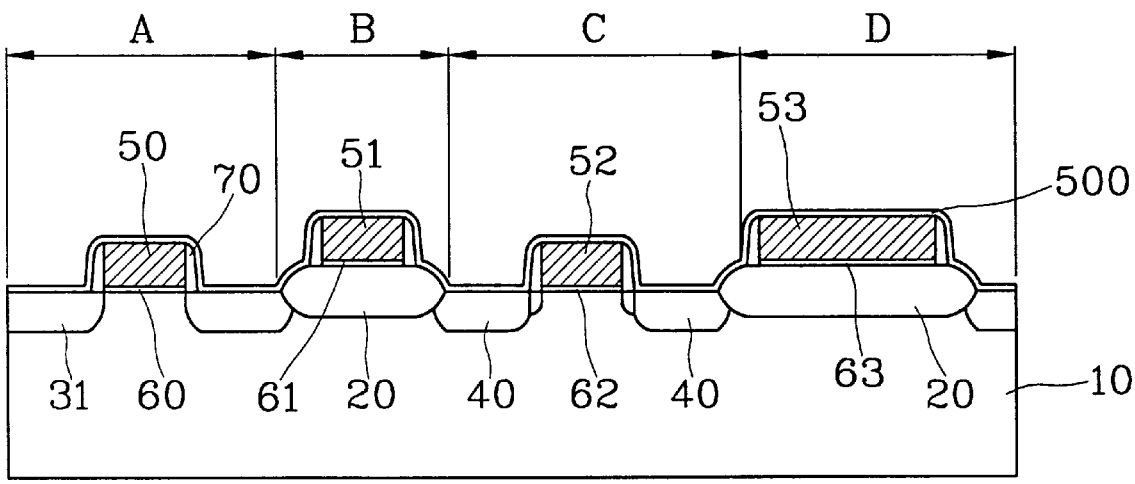
Figure 2:
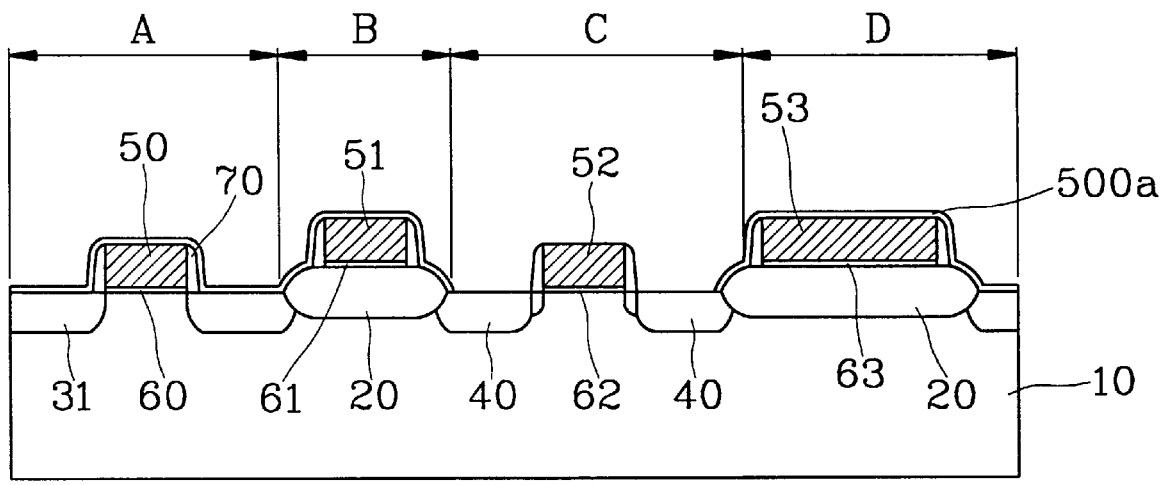
Figure 2:
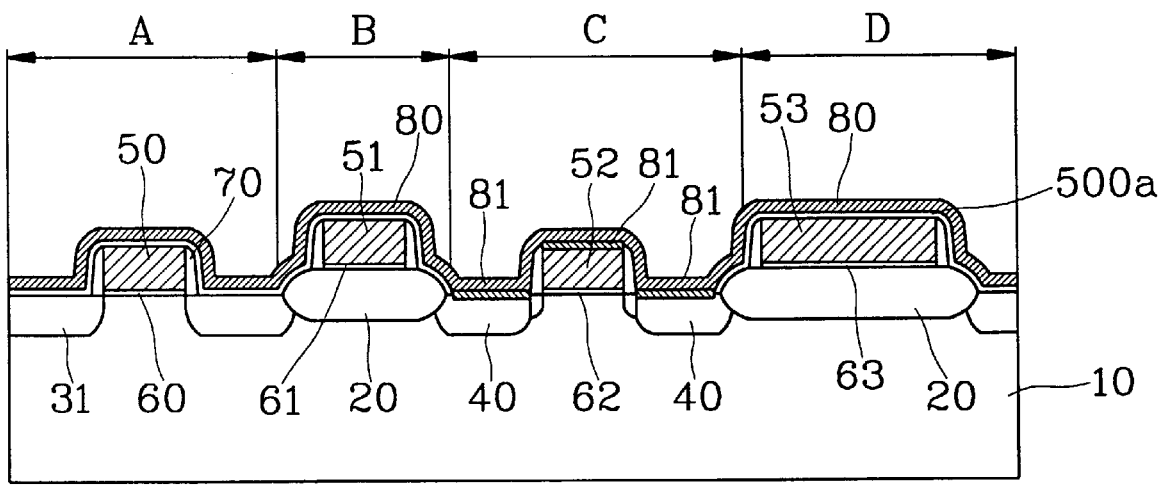
Figure 2:
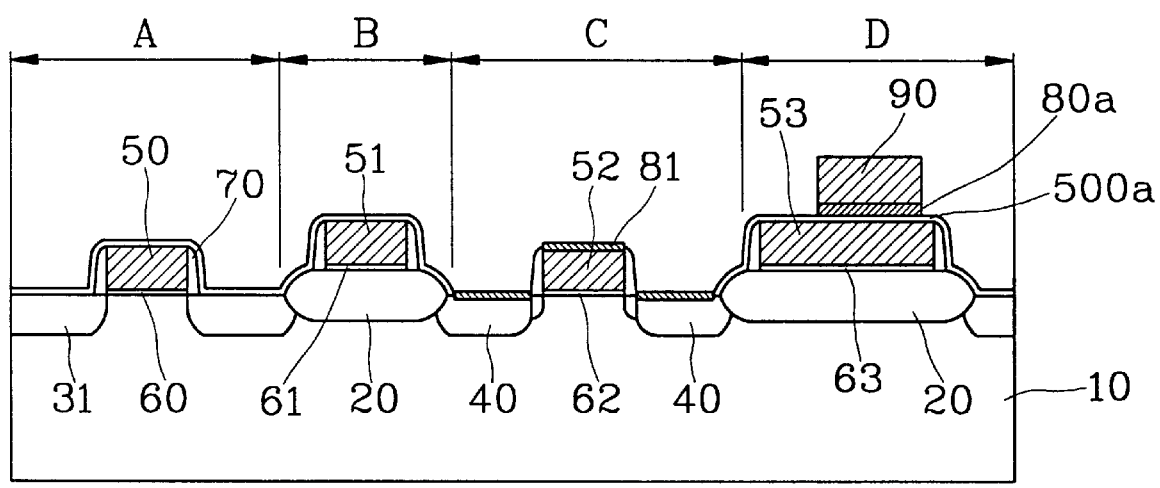

The invention disclosed herein is directed to a process of fabricating an ESD protection circuit without salicide formation. The present invention could be applied to the manufacturing of the complementary metal-oxide semicondutor (CMOS), the bipolar complementary metal-oxide semicondutor (BiCMOS) and the mixed digital/analog system. The present invention could be described through the process of the mixed signal process. Referring now in detail to the drawings for the purpose of illustrating the present invention, the process is as shown in FIGS. 2A to 2E comprising the following steps:

Referring now to FIG. 2A, a substrate 10 with a gate oxide layer and a field oxide layer 20 is provided. Next, the first polysilicon layer is deposited, and then the said gate oxide layer and the said first polysilicon layer are patterned to perform the different functions in different regions. After patterning the said gate oxide layer and the said first polysilicon layer, a layer of gate oxide 60 and a gate structure 50 are formed at the ESD areas A, a gate oxide layer 61 and a resistors 51 are formed at the resistance areas B, a gate oxide layer 62 and a gate electrodes 52 are formed at active areas C and the dielectric layer 63 and a end capacitor electrodes 53 are formed at capacitor areas D. Next, ion implantation is performed to form the doped regions 30 in the substrate 10 as shown in the FIG. 2A.

The field oxide layer 20 is formed by conventional wet oxidation, and the gate oxide layer is formed by conventionl thermal oxidation. The first polysilicon is deposited by low pressure chemical vapor deposition (LPCVD) with a thickness of between 2500 and 3500 Angstroms. The first polysilicon layer can also be doped in-situ. It could control the resistance of the first polysilicon layer in the different areas, if depositing and doping the first polysilicon are performed in separated steps. The step of doping is performed by implanting arsenic ($As^{75}$) or phosphorus ($P^{31}$) ions with an implantation energy of 30 to 100 keV and a dosage between 1E15 and 1E16 $cm^{-2}$. The step of patterning is usually performed by conventional dry etching to define the gate structures 50 and 52, the resistors 51, and the end capacitor electrodes 53.

The following step is a key point of the present invention. Referring to FIG. 2A, a photoresist pattern is formed to mask (i.e., to protect) the active area C and the resistance area B to form non-photolithography (i.e., non-photoresist) areas. The photoresist pattern is neither formed at the ESD area A nor the capacitance area C. Then, ion implantation is performed at the ESD areas A and the end capacitor electrode 53 by implanting arsenic ($As^{75}$) or phosphorus ($P^{31}$) ions with an implantation energy of between 30 to 100 keV and a dosage between 1E15 to 5E16 $cm^{-2}$. It can provide the end capacitor electrode 53 with a lower resistance coefficence.

Referring now to FIG. 2B, an oxide layer is formed on the substrate 10 by chemical vapor deposition (CVD) and the sidewall spacers 70 are formed after etching the oxide layer. Then, the source/drain regions 40 are formed by ion implanting. Thereafter, the following step is another key point of the present invention. An oxide layer 500 is deposited over the substrate 10 and performed by a densification step. The oxide layer 500 can be the insulating layer to prevent the ESD areas A and the resistance areas B from the salicide formation. The oxide layer 500 is formed by chemical vapor deposition (CVD) with a thickness of between 200 and 1000 Angstroms. The densification step is performed about 15 to 45 minutes at a the temperature between 800 to 900° C. in $N_2(g)$. The oxide layer 500 can also be replaced by a nitride layer or a mutilayer of a nitride and oxide. The thickness of the nitride layer is between 600 and 2000 Angstroms.

Referring now to FIG. 2C, a photoresist pattern is formed to mask the ESD areas A, the resistance areas B and capacitor areas D. The oxide layer 500a is formed by dry etching the oxide layer 500 at active areas C. Then, a self-align process is formed over the gate electrodes 52 and source/drain regions 40 as shown in FIG. 2D. The self-align process contains two steps. The first step is forming a metal layer of titanium/titanium nitride layer 80(Ti/TiN). The second step is forming a titanium silicide layer 81($TiSi_2$) of phase 49 by a rapid thermal process(RTP). The oxide layer 500a can protect the ESD areas A, the resistance areas B and capacitor areas D from forming titanium silicide layer ($TiSi_2$) in the self-align process.

The titanium/titanium nitride layer 80(Ti/TiN) is deposited by a sputtering and a rapid thermal process. The titanium layer has a thickness between 300 to 800 Angstroms and the titanium nitride layer has a thickness between 200 to 1000 Angstroms. The titanium/titanium nitride layer 80(Ti/TiN) can also be replaced by a cobalt/titanium nitride layer(Co/TiN). The cobalt layer has a thickness between 50 to 300 Angstroms, and the cobalt nitride layer has a thickness between 200 to 1000 Angstroms.

Referring now to FIG. 2E, a second doped polysilicon layer is deposited over the substrate 10. The second doped polysilicon layer is patterned to form the top capacitor electrodes 90. Then the unreactive titanium/titanium nitride layer 80(Ti/TiN) is removed from the ESD areas A, and the resistance areas B.

The second doped polysilicon layer has a thickness between 500 to 3000 Angstroms. The second doped polysilicon layer is patterned by plasma etching. The second doped polysilicon layer can also be replaced by the titanium/titanium nitride(Ti/TiN) or cobalt/titanium nitride(Co/TiN) to form the top capacitor electrodes 90. The titanium/titanium nitride(Ti/TiN) or cobalt/titanium nitride(Co/TiN) is deposited using the self-align process.

Finally, the titanium silicide 81 of phase C49 is transformed to the titanium silicide 81 of phase C54 with lower resistance in the rapid thermal process(RTP).

As process stated above, there are many advantages of the ESD protection circuit fabrication process according to the present invention:

1. The invention provides a method of fabricating an ESD protection circuit forming one oxide layer. The oxide layer can be both the barrier layer at the ESD areas and the resistor areas and the dielectric layer between the top and end capacitor electrodes.
2. The invention provides the advantages of simplifying process, reducing cost, and improving throughput.
3. The present invention can provide the capacitors with low voltage resistance coefficient. It provides better linear relation between voltage and capacitor. The end capacitor electrodes with ESD ion implantion have high free-electron concentration, and the top capacitor electrode of the titanium/titanium nitride(Ti/TiN) or cobalt/titanium nitride(Co/TiN) also has high free-electron concentration. As a result, the top and end capacitor electrodes can get the low voltage resistance coefficient.

While the invention has been particularly shown and described with reference to a preferred embodiment, it will be understood by those skilled in the art that various changes in form and detail may be made therein without departing from the spirit and scope of the present invention.

What is claimed is:

1. A method for fabricating an analog integrated circuit with electronic discharge (ESD) protection, comprising:
   (a) providing a semiconductor substrate with preformed gate electrodes of ESD areas, end capacitor electrodes, and gate electrodes of active areas;

(b) masking said active areas with a photoresist pattern, and then performing ion implantation at said gate electrodes of ESD areas, and said end capacitor electrodes;
(c) forming sidewall spacers at the lateral sides of said gate electrodes of ESD areas, said end capacitor electrodes and said gate electrodes of active areas;
(d) depositing an oxide layer over said semiconductor substrate, densificating the oxide layer and then etching said densificating oxide layer over said gate electrodes of said active areas;
(e) depositing a metal layer to form a metal silicide layer over the surface of said active areas not covered by said densificating oxide layer; and
(f) forming top capacitor electrodes.

2. The method according to claim 1, wherein said ion implantation is accomplished with of phosphorus ($P^{31}$) ions at a dosage between 1E15 to 5E16 $cm^{-2}$.

3. The method according to claim 1, wherein said densificating oxide layer has a thickness of between 200 to 1000 Angstroms.

4. The method according to claim 1, wherein said densificating oxide layer is formed by filling with $N_2(g)$ at the temperature between 800 to 900 ° C.

5. The method according to claim 1, wherein said metal layer is cobalt silicide ($CoSi_2$).

6. The method according to claim 1, wherein said metal silicide is titanium silicide ($TiSi_2$).

7. The method according to claim 1, wherein said top capacitor electrodes is a mutilayer of polysilicon/titanium/titanium nitride(Si/Ti/TiN).

8. The method according to claim 1, wherein said top capacitor electrodes is a mutilayer of polysilicon/cobalt/titanium nitride(Si/Co/TiN).

9. The method according to claim 1, wherein said top capacitor electrodes is a mutilayer of titanium/titanium nitride(Ti/TiN).

10. The method according to claim 1, wherein said top capacitor electrodes is mutilayer of cobalt/titanium nitride (Co/TiN).

* * * * *